(12) United States Patent
Kreager et al.

(10) Patent No.: US 7,112,970 B2
(45) Date of Patent: Sep. 26, 2006

(54) COAXIAL RADIO FREQUENCY ADAPTER AND METHOD

(75) Inventors: Doug Kreager, Lake Oswego, OR (US); Perla Redmond, Beaverton, OR (US); Kevin B. Redmond, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 10/820,693

(22) Filed: Apr. 7, 2004

(65) Prior Publication Data

US 2004/0239334 A1 Dec. 2, 2004

Related U.S. Application Data

(62) Division of application No. 10/007,672, filed on Dec. 10, 2001, now Pat. No. 6,844,738.

(51) Int. Cl.
*G01R 35/00* (2006.01)
*G01R 27/32* (2006.01)

(52) U.S. Cl. ...................... 324/601; 324/641

(58) Field of Classification Search ............... 324/601, 324/538, 650, 754, 609, 641; 439/578, 108
See application file for complete search history.

(56) References Cited

U.S. PATENT DOCUMENTS

| | | | | |
|---|---|---|---|---|
| 3,904,959 A | * | 9/1975 | Britton, Jr. ................... | 324/601 |
| 4,734,064 A | | 3/1988 | Knapp et al. ................ | 439/852 |
| 5,066,919 A | | 11/1991 | Klassen et al. | |
| 5,096,444 A | | 3/1992 | Lu et al. ..................... | 439/750 |
| 5,157,337 A | * | 10/1992 | Neel et al. ................... | 324/632 |
| 5,456,611 A | | 10/1995 | Henry et al. ................ | 439/180 |
| 5,482,475 A | | 1/1996 | Kawaguchi .................. | 439/394 |
| 5,498,175 A | | 3/1996 | Yeh et al. ................... | 439/578 |
| 5,537,046 A | | 7/1996 | Adamian et al. | |
| 5,587,934 A | | 12/1996 | Oldfield et al. | |
| 5,661,404 A | | 8/1997 | Yanagawa et al. | |
| 5,683,263 A | | 11/1997 | Hsu ........................... | 439/319 |
| 5,722,856 A | | 3/1998 | Fuchs et al. ................. | 439/578 |
| 5,748,002 A | * | 5/1998 | Scott et al. .................. | 324/633 |
| 5,820,408 A | | 10/1998 | Wang .......................... | 439/610 |
| 5,865,654 A | | 2/1999 | Shimirak et al. ............ | 439/852 |
| 5,945,835 A | * | 8/1999 | McDonough et al. ........ | 324/754 |
| 6,019,635 A | | 2/2000 | Nelson ........................ | 439/583 |
| 6,019,636 A | | 2/2000 | Langham ..................... | 439/583 |
| 6,171,143 B1 | | 1/2001 | Charles et al. .............. | 439/579 |
| 6,210,222 B1 | | 4/2001 | Langham et al. ........... | 439/584 |
| 6,227,868 B1 | | 5/2001 | Wlodarski ................... | 439/63 |
| 6,229,327 B1 | | 5/2001 | Boll et al. | |
| 6,239,385 B1 | | 5/2001 | Schwiebert et al. | |
| 6,261,126 B1 | | 7/2001 | Stirling ....................... | 439/583 |
| 6,281,690 B1 | | 8/2001 | Frey ........................... | 324/754 |

(Continued)

OTHER PUBLICATIONS

Amalia D. Parthenios, SBC Extends Broadband Arm Through Yahoo, Covad Deals, www.telephonyonline.com, Nov. 19, 2001, 1 page.

*Primary Examiner*—Anjan Deb
(74) *Attorney, Agent, or Firm*—Blakely, Sokoloff, Taylor & Zafman LLP (57) ABSTRACT

A coaxial radio frequency adapter and method are disclosed. An adapter has a tapered signal pin and a tapered ground sleeve to maintain a consistent impedance and minimize reflections while connecting two elements having different dimensions. A method employs an adapter to characterize losses in a system for evaluating a device under test.

20 Claims, 10 Drawing Sheets

U.S. PATENT DOCUMENTS

| | | |
|---|---|---|
| 6,428,356 B1 | 8/2002 | Dole |
| 6,538,454 B1 * | 3/2003 | Frenkel et al. .............. 324/637 |
| 6,724,205 B1 | 4/2004 | Hayden et al. |
| 2005/0262953 A1 * | 12/2005 | Pooley et al. .............. 73/866.5 |

* cited by examiner

TOP VIEW

FIG. 5

BOTTOM VIEW

TOP VIEW

FIG. 8

BOTTOM VIEW

COAXIAL RADIO FREQUENCY ADAPTER AND METHOD

This is a Divisional Application of Ser. No. 10/007,672 filed Dec. 10, 2001, now U.S. Pat. No. 6,844,738 B2 issued on Jan. 18, 2005.

BACKGROUND

There are many environments which require that a transmission loss be small, characterizable, and/or predictable. For example, in a system for performing a production test on a radio frequency (RF) device under test (DUT), an RF test probe may be used to contact the DUT. The DUT may for example be an integrated circuit board for a wireless communication device.

Figure 1:
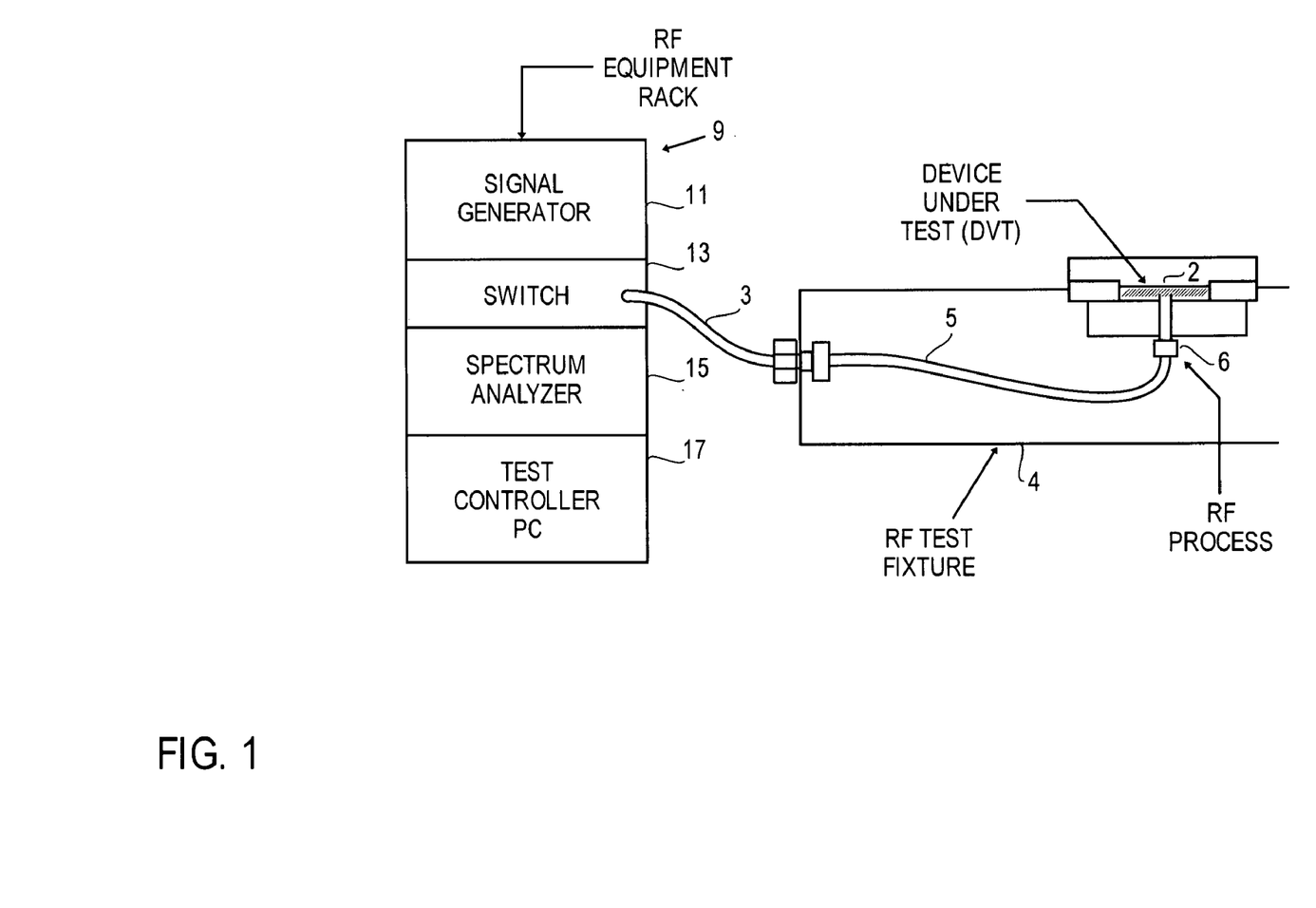
FIG. 1 illustrates a production test configuration used to evaluate a device under test.

As shown in FIG. 1, DUT 2 may be placed in RF test fixture 4. RF probe 6 may be mounted in RF test fixture 4 in a position to contact DUT 2. RF probe 6 may be connected by coaxial cable 5 and coaxial cable 3 to RF equipment rack 9. RF equipment rack 9 may include a signal generator 11, a switch 13, a spectrum analyzer 15, and a test controller PC 17. In FIG. 1, coaxial cable. 5 is shown in electrical communication with switch 13 through coaxial cable 3. Test controller PC 17 may connect coaxial cable 5 through switch 13 to spectrum analyzer 15 in order to measure the RF transmitting power of DUT 2. Alternatively, test controller PC 17 may connect coaxial cable 5 through switch 13 to signal generator 11 in order to measure the RF receiving sensitivity of DUT 2.

Such measurements may be made during production runs of DUT 2 for quality control purposes.

DETAILED DESCRIPTION OF THE PREFERRED EMBODIMENT

FIG. 1 illustrates a production test configuration used to evaluate DUT 2. Because the production test configuration may be used to measure RF characteristics associated with DUT 2, the inventors desire to know the extent of RF signal loss associated with the test equipment itself.

A vector network analyzer can be used to evaluate RF signal loss through a closed circuit. For example, a closed circuit including RF test probe 6 but not including any device under test could be evaluated. Typically, RF test probe 6 can be easily connected at one end to a coaxial cable. The other end (the "contact end") of RF test probe 6, however, is meant for press-contact with DUT 2 and cannot easily be connected to a coaxial cable. For example, the contact end may be spring loaded so that the test probe is urged against DUT 2. The contact end may have a sharp crown edge. An adapter of the present invention may be used to connect the contact end of RF test probe 6 to a sub-miniature assembly (SMA) connector of a coaxial cable.

Figure 2:
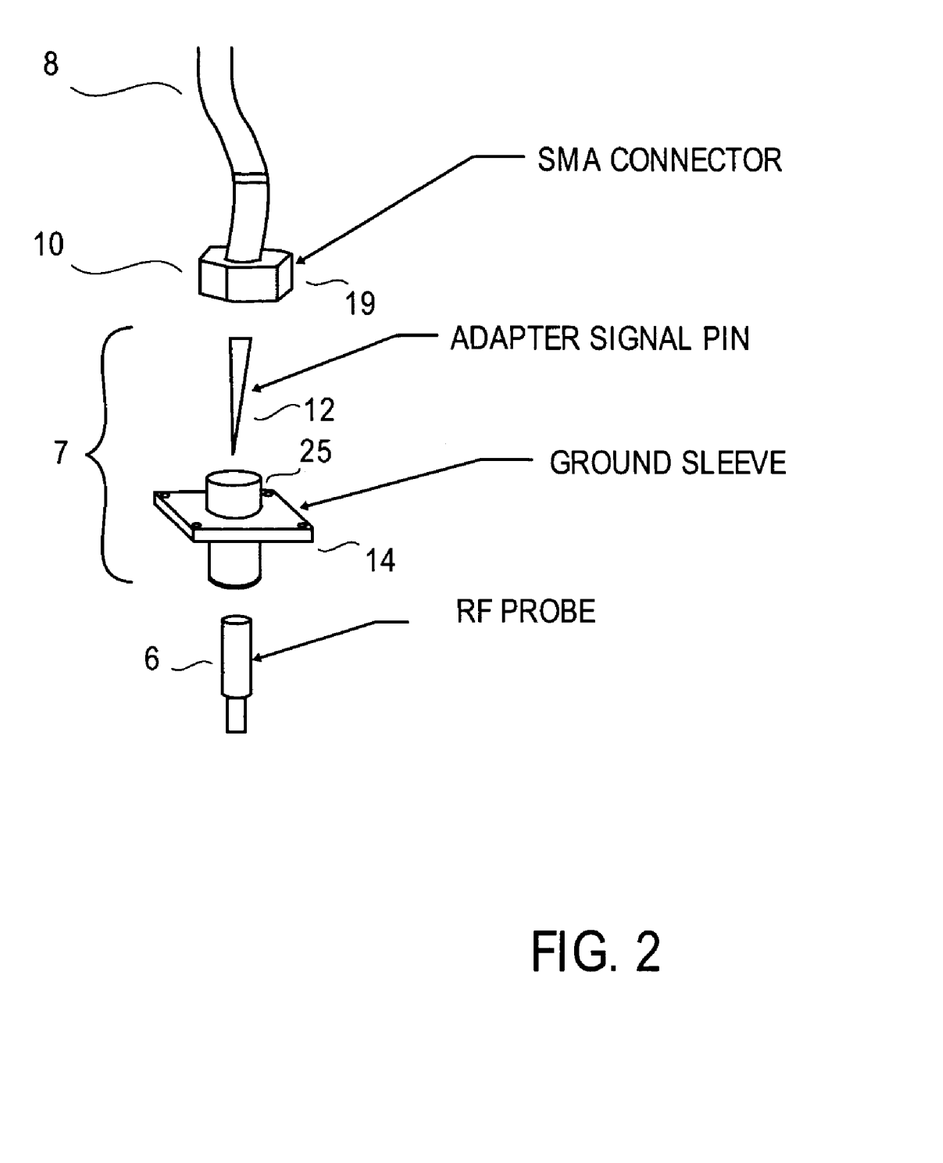
FIG. 2 is an exploded view of an adapter in relation to a radio frequency probe and a coaxial cable.

FIG. 2 is an exploded view of adapter 7 in relation to RF probe 6 and coaxial cable 8. Adapter 7 is devised to electrically connect RF probe 6 to coaxial cable 8 with no change in impedance and no reflections. Adapter 7 includes adapter ground sleeve 14 and adapter signal pin 12. Adapter signal pin 12 fits inside of adapter ground sleeve 14. Adapter signal pin 12 may be spaced apart from adapter ground sleeve 14 by a dielectric material surrounding at least part of adapter signal pin 12. Adapter ground sleeve 14 may be made of copper or other conductive material that is softer than the contact end of RF test probe 6 in order to facilitate a good press-connection between adapter ground sleeve 14 and RF test probe 6.

Coaxial cable 8 has SMA connector 10 including barrel nut 19. Barrel nut 19 serves as the ground lead of coaxial cable 8. Adapter ground sleeve 14 has screw threads 25 adapted to engage barrel nut 19 of coaxial cable 8.

Figure 3:
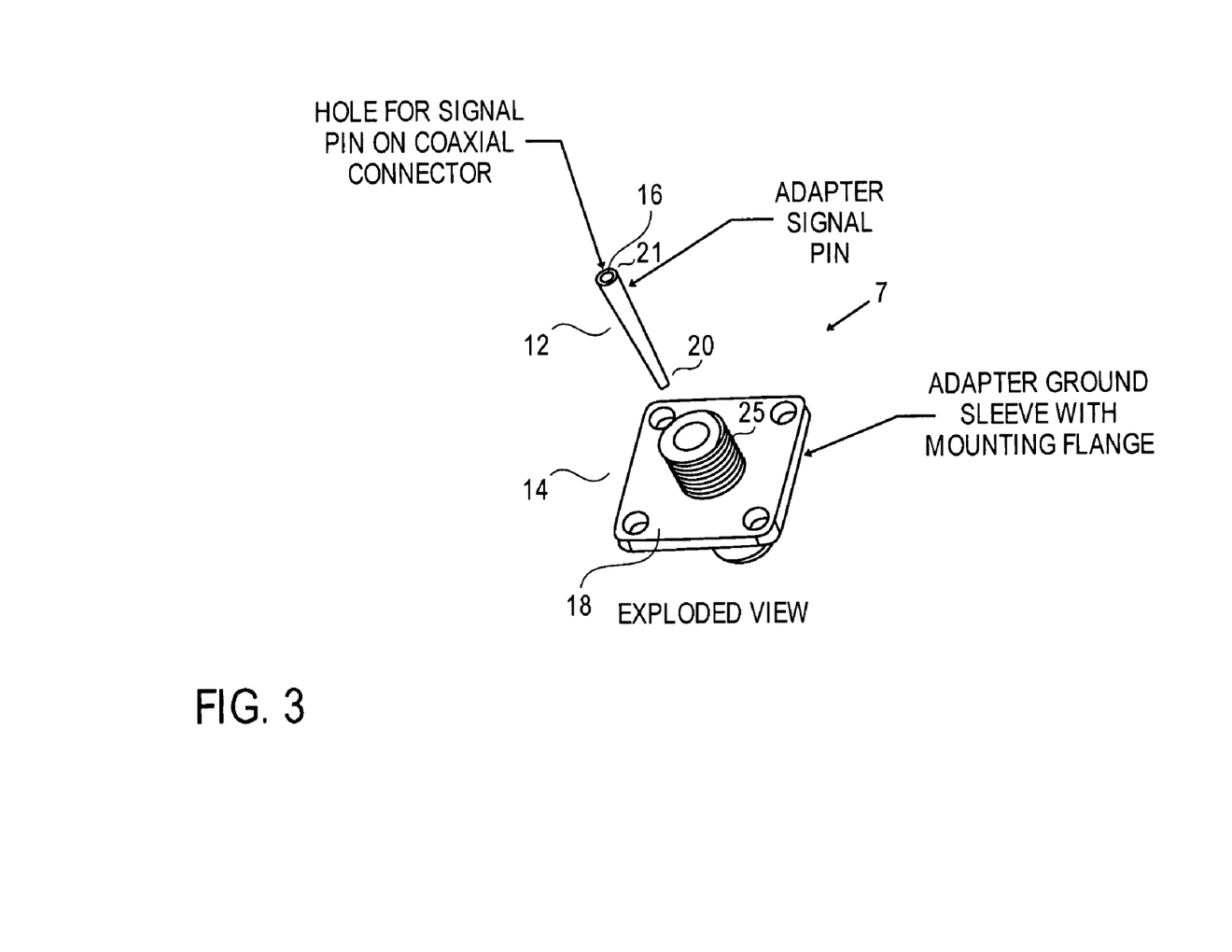
FIG. 3 is an exploded close-up view of the adapter of FIG. 2.

FIG. 3 is an exploded close-up view of adapter 7. Adapter ground sleeve 14 has mounting flange 18. Adapter signal pin 12 has a probe contact end 20 and a cable contact end 21. At cable contact end 21, adapter signal pin 12 has hole 16 for receiving connector signal pin 30 (FIG. 7) from SMA connector 10 of coaxial cable 8. Connector signal pin 30 serves as the signal lead of coaxial cable 8.

Figure 4:
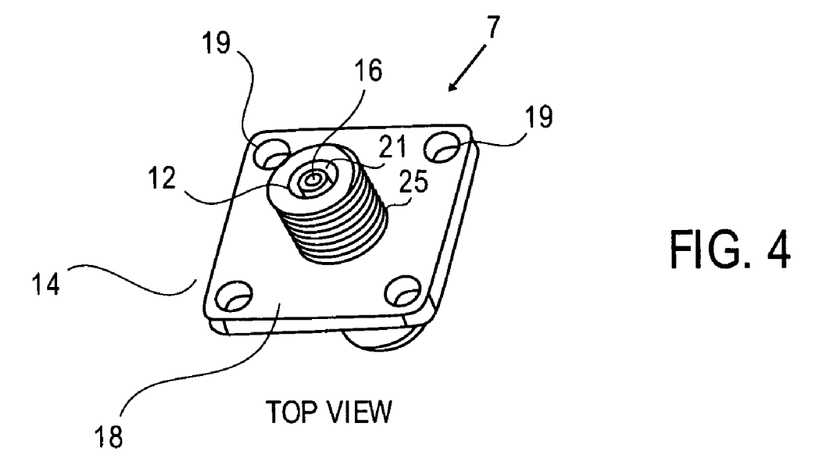
FIG. 4 is a close-up top view of the adapter of FIG. 2 in unexploded form.

FIG. 4 is a top view of adapter 7. Adapter signal pin 12 is shown inside of adapter ground sleeve 14. Mounting flange 18 has screw holes 19.

Figure 5:
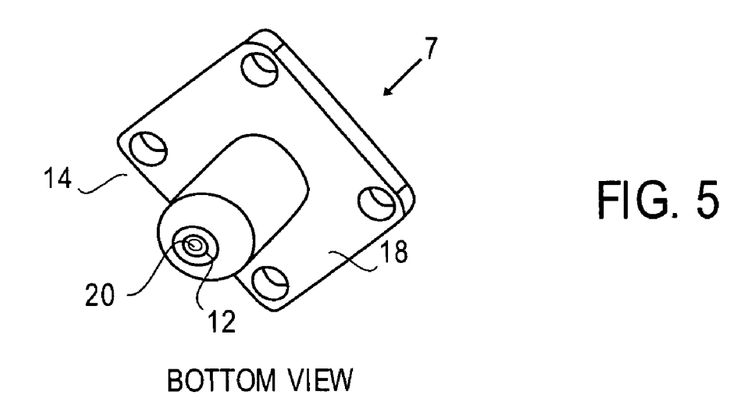
FIG. 5 is a close-up bottom view of the adapter of FIG. 2 in unexploded form.

FIG. 5 is a bottom view of adapter 7. Adapter signal pin 12 is shown inside of adapter ground sleeve 14.

Figure 6:
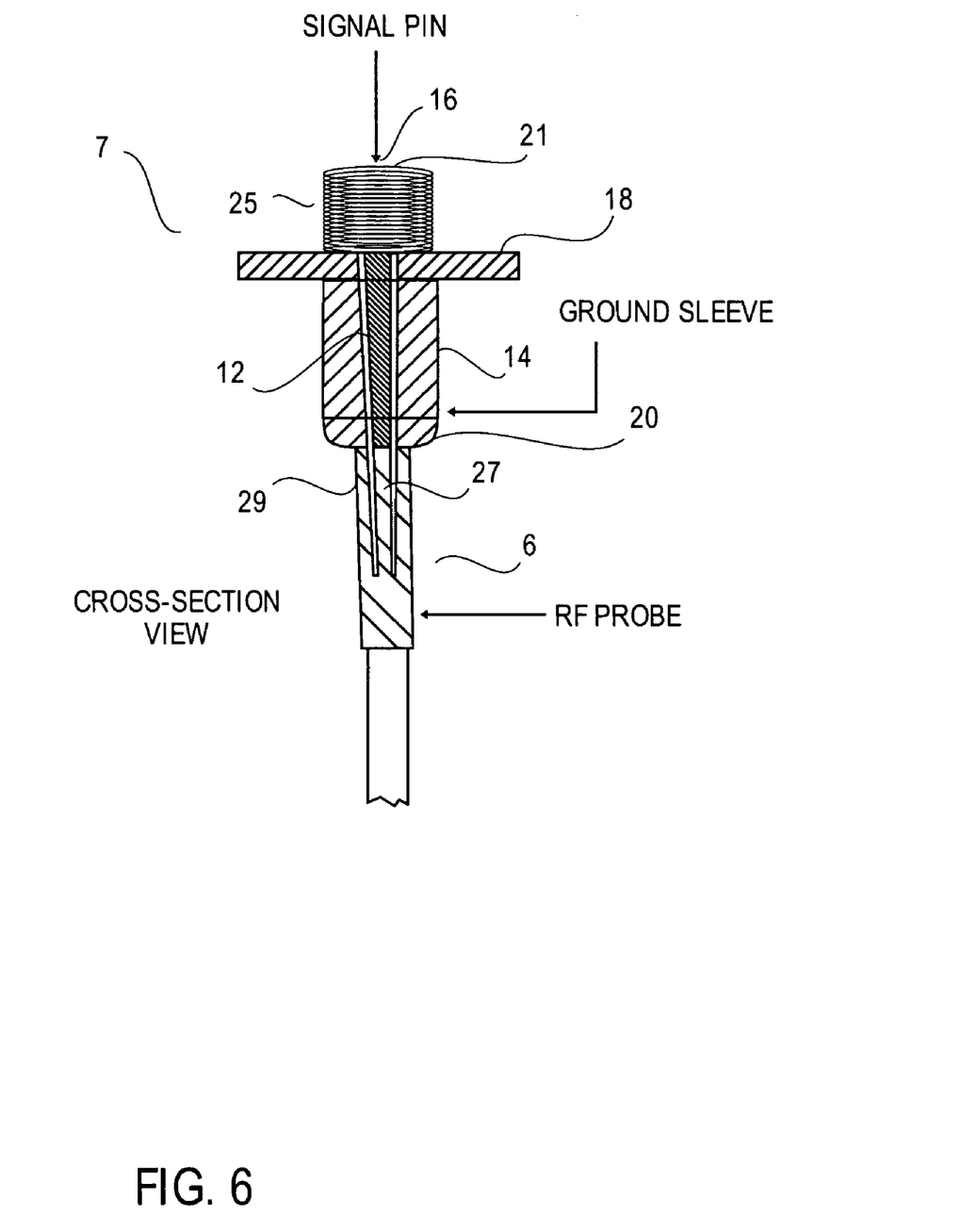
FIG. 6 is a cross-section view of the adapter of FIG. 2 in press-contact with a radio frequency probe.

FIG. 6 is a cross-section view of adapter 7 in press-contact with RF probe 6. RF probe 6 has RF probe signal pin 27 and RF probe ground sleeve 29. RF probe signal pin 27 contacts adapter signal pin 12; RF probe ground sleeve 29 contacts adapter ground sleeve 14. RF probe signal pin 27 acts as a signal probe and RF ground sleeve 29 acts as a ground probe.

Figure 7:
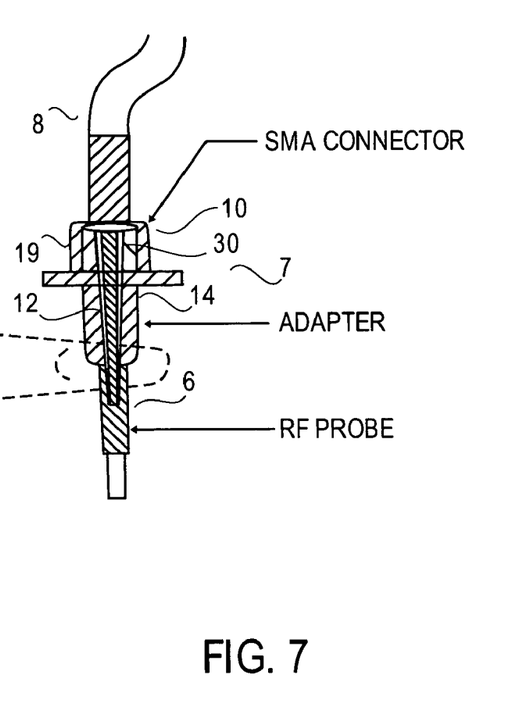
FIG. 7 is a cross-section view of the adapter of FIG. 2 in press-contact with a radio frequency probe and in screw engagement with the sub-miniature assembly connector of a coaxial cable.

FIG. 7 is a cross-section view of adapter 7 in press-contact with RF probe 6 and in screw engagement with SMA connector 10 of coaxial cable 8. SMA connector 10 has connector signal pin 30. Connector signal pin 30 is received in hole 16 at cable contact end 21 of adapter signal pin 12.

Figure 7A:
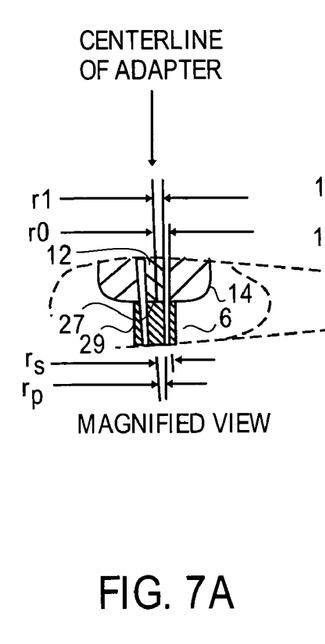
FIG. 7a is an enlarged view of part of FIG. 7.

FIG. 7a is a magnified view of part of FIG. 7. Adapter signal pin 12 is characterized by an inner radius $r_i$. This is the distance from the center of adapter signal pin 12 to the outside surface of adapter signal pin 12. Ground sleeve 14 is characterized by outer radius $r_o$. This is the distance from the center of ground sleeve 14 to the inner surface of ground sleeve 14.

The design of adapter 7 may be adjusted to achieve a desired impedance according to the formula:

$$Z_o = \frac{\ln(r_o/r_i)\sqrt{\mu/\varepsilon}}{2\pi}$$

where
- $\mu$=relative magnetic permeability of the conductor material of the adapter signal pin and the adapter ground sleeve;
- $\varepsilon$=relative permittivity of the dielectric material;
- $r_i$=signal pin radius;
- $r_o$=radius of the inside surface of the ground sleeve.

For example, a dielectric material surrounding adapter signal pin 12 may be selected having a particular dielectric constant. As another example, the ratio $r_o/r_i$ can be adjusted. As a third example, the material of adapter signal pin 12 and adapter ground sleeve 14 may be adjusted according to the same formula. Any combination of those three exemplary adjustments may be made to optimize the impedance equation for a particular application. In particular applications, adapter 7 may be designed to have an impedance of 50 ohms for use in a wireless communication environment, or an impedance of 75 ohms for use in a television environment, for example.

The sides of SMA connector 10 and/or ground sleeve 14 may have flats to facilitate assembly using a torque wrench, which creates consistent tightness and repeatable signal loss through the connections.

RF probe signal pin 27 is characterized by probe pin radius $r_p$. This is the distance from the center of RF probe signal pin 27 to the outer surface of RF probe signal pin 27. RF probe ground sleeve 29 is characterized by probe sleeve radius $r_s$. This is the distance from the center of RF probe ground sleeve 29 the inside surface of RF probe ground sleeve 29. In a preferred embodiment shown in FIG. 7a, at the point where adapter 7 contacts RF probe 6, probe pin radius $r_p$ is equal to inner radius $r_i$ and probe sleeve radius $r_s$ is equal to outer radius $r_o$.

In an exemplary application, probe pin radius $r_p$ is smaller than the radius of connector signal pin 30 and probe sleeve radius $r_s$ is smaller than the radius of the inside of barrel nut 19. In such a situation, as shown in FIG. 7, adapter 7 provides a gradually tapered transition from the large dimensions of SMA connector 10 to the smaller dimensions of RF test probe 6 without any abrupt steps that could create reflections, signal loss, or parasitic capacitances. The taper design of adapter 7 can be changed to create smooth impedance-matched transitions between various size connectors.

Preferably, adapter 7 has the same impedance as RF probe 6 and coaxial cable 8. Maintaining the ratio $r_o/r_i$ along the length of adapter 7, from probe contact end 20 to cable contact end 21, can ensure a consistent impedance throughout adapter 7. Thus, there is provided an adapter that connects two different size components and minimizes signal loss, reflection, and parasitic capacitances.

Figure 8:
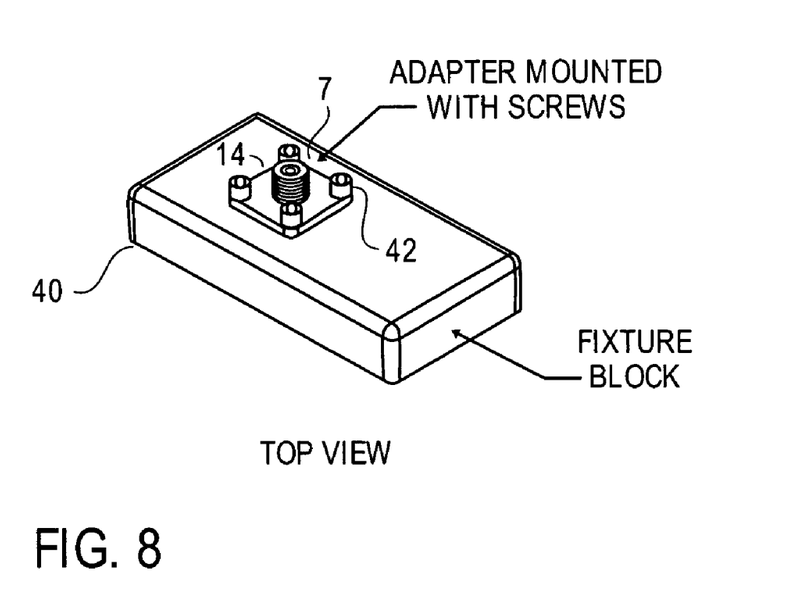
FIG. 8 is a top view of the adapter mounted onto a fixturing block.

FIG. 8 is a top view of adapter 7 mounted with screws 42 onto fixturing block 40.

Figure 9:
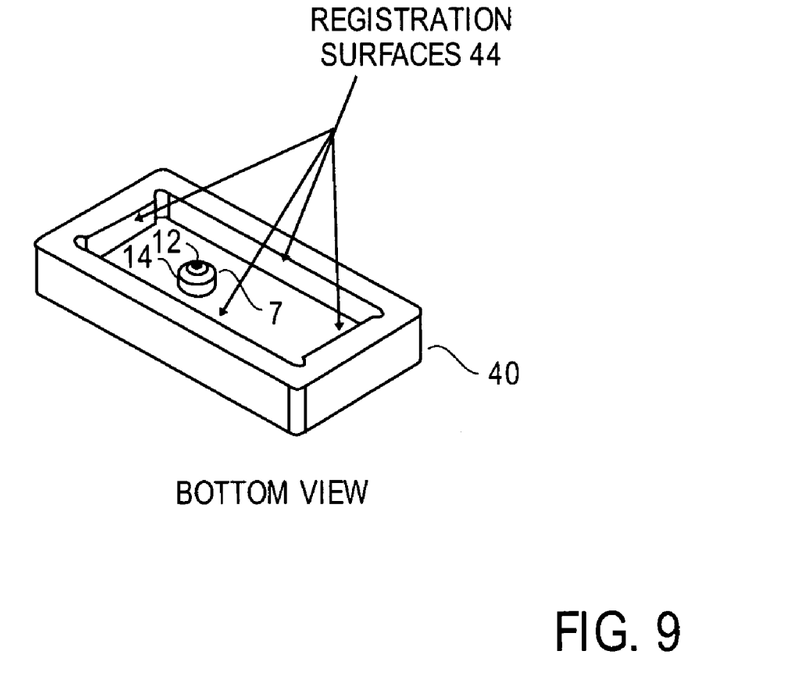
FIG. 9 is a bottom view of the assembly of FIG. 8.

FIG. 9 is a bottom view of the assembly of FIG. 8. Registration surfaces 44 line the underside of fixturing block 40.

Figure 10:
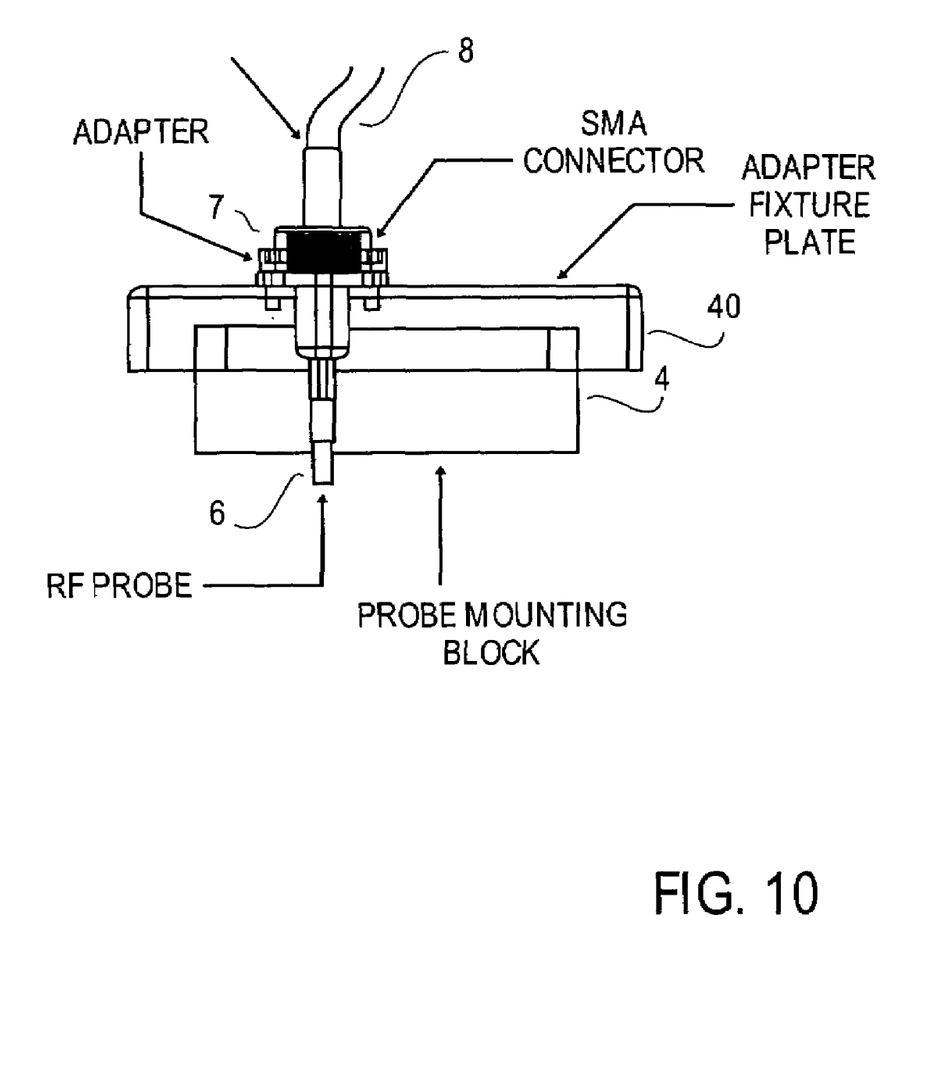
FIG. 10 shows the assembly of FIG. 8 in contact with an RF test fixture, an RF test probe, and a coaxial cable.

FIG. 10 shows the assembly of FIG. 8 in contact with RF test fixture 4, RF test probe 6, and coaxial cable 8. RF test probe 6 is mounted on RF test fixture 4. Registration surfaces 44 of fixturing block 40 line up with elements (not shown) on RF test fixture 4 in order to accurately place adapter 7 in axial alignment with RF test probe 6. This arrangement exemplifies a use for adapter 7 to characterize losses associated with the test equipment of FIG. 1.

Figure 11:
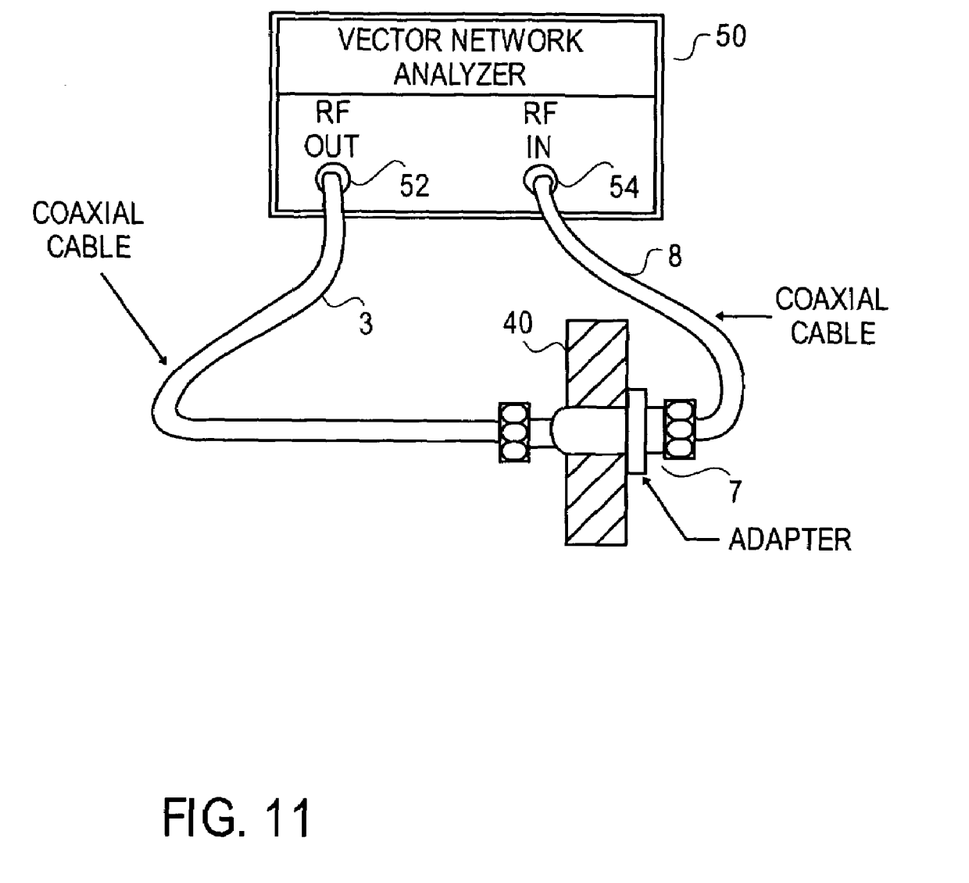
FIG. 11 illustrates a calibration configuration.

FIG. 11 illustrates a calibration configuration in which vector network analyzer 50 is used to characterize losses in a system without a test fixture. Vector network analyzer 50 has RF out port 52 and RF in port 54. One end of coaxial cable 3 is connected to RF out port 52. The other end has an SMA connector which contacts adapter 7 in fixturing block 40. Adapter 7 is connected to coaxial cable 8, which in turn is connected to RF in port 54.

Figure 12:
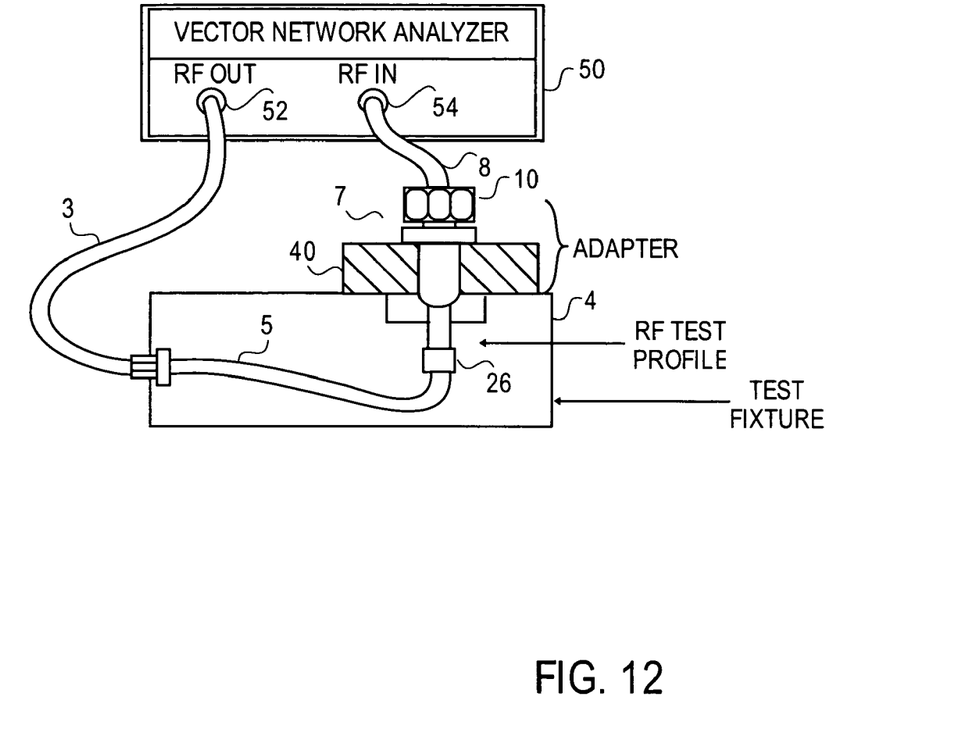
FIG. 12 illustrates a testing configuration for characterizing losses in a system with a test fixture.

FIG. 12 illustrates a testing configuration in which vector network analyzer 50 is used to characterize losses in a system having a test fixture. Coaxial cable 3 is connected to RF out port 52 and is connected to coaxial cable 5. Thus, coaxial cable 5 is in electrical communication with RF out port 52 through coaxial cable 3. Coaxial cable 5 is fixed in test fixture 4 and is connected to RF test probe 6. RF test probe 6 is fixed in test fixture 4 and is shown in press contact with adapter 7. The position of adapter 7 is fixed by fixturing plate 40 such that adapter 7 is in axial alignment with RF test probe 6. Adapter 7 is connected to SMA connector 10 of coaxial cable 8. Coaxial cable 8 is connected to RF in port 54.

Taken together, FIG. 11, FIG. 12, and FIG. 1 can be used to illustrate a method exemplifying the present invention. The method comprises the following.

First, as shown in FIG. 11, coaxial cable 3, adapter 7, and coaxial cable 8, all having the same impedance, are connected in series to form a calibration configuration in which adapter 7 contacts an SMA connector of coaxial cable 3. Second, a first radio frequency signal is sent through the calibration configuration illustrated in FIG. 11. Third, a first loss is measured in the first radio frequency signal after the first radio frequency signal is sent through the calibration configuration of FIG. 11.

Fourth, as shown in FIG. 12, coaxial cable 5 and radio frequency test probe 6 are fixed in test fixture 4. Fifth, coaxial cable 3, coaxial cable 5 and radio frequency test probe 6 in test fixture 4, adapter 7, and coaxial cable 8 are connected in series to form a test configuration in which adapter 7 contacts radio frequency test probe 6. Sixth, a second radio frequency signal is sent through the test configuration shown in FIG. 12. Seventh, a second loss is measured in the second radio frequency signal after the second radio frequency signal is sent through the test configuration of FIG. 12.

Eighth, the first loss is subtracted from the second loss to derive a fixture loss. Knowing the fixture loss is useful when analyzing test readings for DUT 2 as described above with reference to FIG. 1. Accurate characterization of loss through the test equipment ensures that the measured RF characteristics of DUT 2 are not affected by losses. That is, the losses associated with coaxial cable 5, coaxial cable 3, and radio frequency test probe 6 in test fixture 4, are added back to the transmission and receive measurements of DUT 2 to determine the true (corrected) performance of the DUT itself.

The fourth through eighth steps may be repeated for other test fixtures. In other words, the first through fourth steps can be performed one time in order to characterize the calibration equipment consisting of coaxial cable 3, adapter 7, and coaxial cable 8. The calibration equipment may then be used to characterize accurately each of a plurality of test fixtures where each of the test fixtures has its own RF test probe fixed thereto. Once the RF signal loss attributable to the calibration equipment is known, the calibration equipment can be used repeatedly to determine the RF signal loss in any of a number of fixtures. Such fixtures can then be used to evaluate RF characteristics associated with DUTs. One such fixture is shown in FIG. 1.

The above disclosure and drawings merely illustrate the inventive concepts. The skilled artisan will recognize therefrom that many variations and permutations can be made without departing from the spirit of the invention. The exemplary embodiments disclosed herein are not meant to limit the scope of the invention.

What is claimed is:

1. A method comprising:
   connecting in series at least a first coaxial cable, an adapter, and a second coaxial cable, all having the same impedance, to form a calibration configuration;
   sending a first radio frequency signal through the calibration configuration;
   measuring a first loss in the radio frequency signal after the first radio frequency signal is sent through the calibration configuration;
   placing a radio frequency test probe in a test fixture;
   connecting in series at least the first coaxial cable, the radio frequency test probe in the test fixture, the adapter, and the second coaxial cable to form a test configuration in which the adapter contacts the radio frequency test probe;
   sending a second radio frequency signal through the test configuration;
   measuring a second loss in the second radio frequency signal after the second radio frequency signal is sent through the test configuration; and
   subtracting the first loss from the second loss to derive a fixture loss.

2. The method of claim 1 further comprising:
   contacting a device under test with the radio frequency test probe in the test fixture.

3. The method of claim 2 wherein the calibration configuration includes no wireless component, the test configuration includes no wireless component, and the device under test is a wireless component.

4. The method of claim 1 wherein the adapter comprises:
   a ground sleeve having a first ground sleeve end adapted to contact a ground lead of a coaxial cable and a second ground sleeve end adapted to contact a ground probe of the test probe; and
   a signal pin positioned inside of and spaced apart from the ground sleeve, the signal pin having a first signal pin end adapted to contact a signal lead of a coaxial cable and a second signal pin end adapted to contact a signal probe of the test probe.

5. The method of claim 4 wherein:
   the ground sleeve is characterized by a first outer radius at said first ground sleeve end and a second outer radius at said second ground sleeve end;
   the first outer radius is different than the second outer radius;
   the signal pin is characterized by a first inner radius at said first signal pin end and a second inner radius at said second signal pin end;
   the first inner radius is different than the second inner radius; and
   a ratio of the first inner radius to the first outer radius is the same as the ratio of the second inner radius to the second outer radius.

6. The method of claim 5 wherein the signal pin and the ground sleeve are both tapered to maintain said ratio constant throughout the adapter.

7. A method of forming a calibration configuration comprising:
   connecting an adapter to a first coaxial cable, the adapter having a first end configured to join with said first coaxial cable and a second end configured to mate with a radio frequency probe;
   mating a radio frequency probe to said adapter;
   connecting a second coaxial cable to said radio frequency probe; and
   obtaining a first signal loss through the calibration configuration.

8. The method of claim 7 wherein the adapter comprises:
   a ground sleeve having a first ground sleeve end and a second ground sleeve end, said first ground sleeve end having a first outer radius and said second ground sleeve end having a second outer radius different from said first outer radius;
   a signal pin having a first signal pin end adapted to communicate with said first coaxial cable and a second signal pin end adapted to communicate with said radio frequency probe, said signal pin contained within said ground sleeve; and
   a dielectric material between said ground sleeve and said signal pin.

9. The method of claim 8 wherein the impedance of said adapter is substantially uniform from said first end to said second end.

10. The method of claim 9 wherein said signal pin and said ground sleeve are tapered.

11. The method of claim 9 wherein the impedance of said adapter is approximately 50 ohms.

12. The method of claim 8 wherein a ratio of said first inner radius to the first outer radius is the same as the ratio of said second inner radius to said second outer radius.

13. The method of claim 7 wherein the calibration configuration further comprises:
   placing said radio frequency probe in a test fixture to form a test configuration; and
   obtaining a second signal loss through said test configuration.

14. A method comprising:
   forming a calibration configuration including a first coaxial cable, an adapter, and a second coaxial cable, said adapter configured to mate with a radio frequency probe and said second coaxial cable;
   obtaining a first signal loss through said calibration configuration;
   forming a test configuration including said first coaxial cable, said second coaxial cable, said adapter, and said radio frequency probe; and
   obtaining a second signal loss through said test configuration.

15. The method of claim 14 wherein said test configuration includes a test fixture configured to receive said radio frequency probe.

16. The method of claim 14 wherein the adapter includes a ground sleeve and a signal pin, said signal pin positioned inside of and spaced apart from said ground sleeve.

17. The method of claim 16 wherein the adapter further comprises said ground sleeve having a first ground sleeve end and a second ground sleeve end, said first ground sleeve end having a first outer radius and said second ground sleeve end having a second outer radius, said signal pin having a first signal pin end including a first inner radius and a second signal pin end including a second inner radius; and a ratio of the first inner radius to the first outer radius is approximately equivalent to the ratio of the second inner radius to the second outer radius.

18. The method of claim 17 wherein the signal pin and the ground sleeve are tapered.

19. The method of claim 14 further comprising evaluating a device under test in said test fixture.

20. The method of claim 19 wherein said device under test is a wireless component.

* * * * *